(12) United States Patent
Choi

(10) Patent No.: US 9,414,163 B2
(45) Date of Patent: Aug. 9, 2016

(54) AMPLIFIER CAPABLE OF CONTROLLING CUT-OFF FREQUENCY IN REAL TIME AND AMPLIFICATION METHOD FOR CONTROLLING CUT-OFF FREQUENCY IN REAL TIME

(71) Applicant: Neofidelity, Inc., Seoul (KR)

(72) Inventor: Yeongha Choi, Seoul (KR)

(73) Assignee: NEOFIDELITY, INC., Seoul (KR)

( * ) Notice: Subject to any disclaimer, the term of this patent is extended or adjusted under 35 U.S.C. 154(b) by 185 days.

(21) Appl. No.: 14/315,048

(22) Filed: Jun. 25, 2014

(65) Prior Publication Data

US 2015/0264481 A1    Sep. 17, 2015

(30) Foreign Application Priority Data

Mar. 14, 2014    (KR) .................. 10-2014-0029465

(51) Int. Cl.
| | | |
|---|---|---|
| H04R 3/04 | (2006.01) | |
| H03F 3/183 | (2006.01) | |
| H03F 3/217 | (2006.01) | |
| H04R 3/00 | (2006.01) | |
| H03G 9/00 | (2006.01) | |
| H03G 9/02 | (2006.01) | |

(52) U.S. Cl.
CPC .................. *H04R 3/04* (2013.01); *H03F 3/183* (2013.01); *H03F 3/217* (2013.01); *H03G 9/005* (2013.01); *H03G 9/02* (2013.01); *H04R 3/002* (2013.01); *H03F 2200/03* (2013.01); *H03F 2200/171* (2013.01); *H04R 3/007* (2013.01)

(58) Field of Classification Search
CPC ........................................................ H04R 3/04
See application file for complete search history.

(56) References Cited

U.S. PATENT DOCUMENTS

| | | | | |
|---|---|---|---|---|
| 5,481,617 A * | 1/1996 | Bjerre | ................... | H03G 5/165 381/107 |
| 8,073,149 B2 * | 12/2011 | Kuze | ........................ | H04R 3/08 381/71.11 |
| 2005/0207584 A1 * | 9/2005 | Bright | .................... | H04R 3/007 381/59 |
| 2012/0300949 A1 * | 11/2012 | Rauhala | ............... | H04R 29/001 381/55 |
| 2014/0254805 A1 * | 9/2014 | Su | .......................... | H04R 3/007 381/55 |

FOREIGN PATENT DOCUMENTS

| | | |
|---|---|---|
| JP | 2001-102982 | 4/2001 |
| JP | 2007-060648 | 3/2007 |
| JP | 2007-074442 | 3/2007 |

OTHER PUBLICATIONS

Korean Office Action dated Jan. 26, 2016, issued by the Korean Patent Office in corresponding application 10-2014-0029465.

* cited by examiner

*Primary Examiner* — Paul Huber
(74) *Attorney, Agent, or Firm* — Stein IP, LLC

(57) ABSTRACT

An amplifier and an amplification method are provided. In accordance with the present invention, a cut-off frequency of variable high-pass filter is dynamically adjusted in real time according to a low frequency level of an input audio signal to prevent a distortion of the audio signal and damage of loudspeaker.

13 Claims, 6 Drawing Sheets

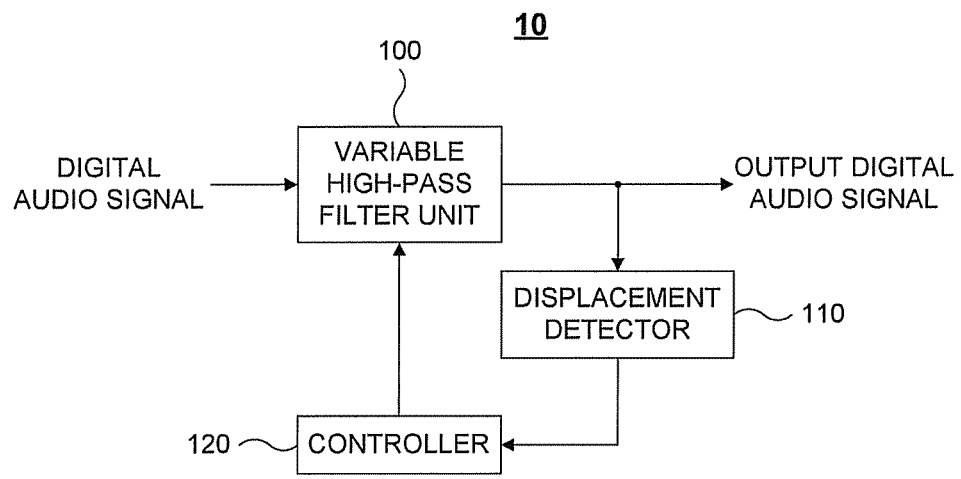
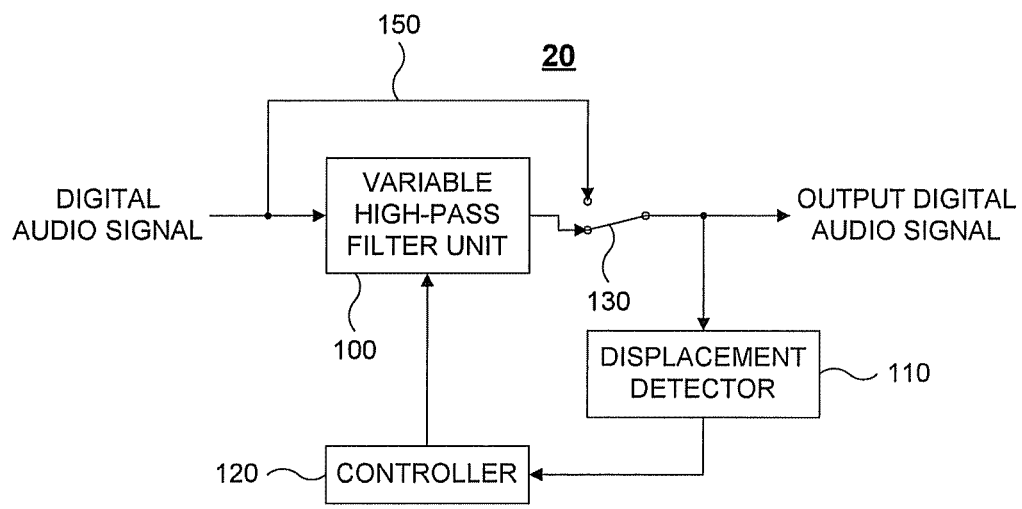

AMPLIFIER CAPABLE OF CONTROLLING CUT-OFF FREQUENCY IN REAL TIME AND AMPLIFICATION METHOD FOR CONTROLLING CUT-OFF FREQUENCY IN REAL TIME

CROSS-REFERENCE TO RELATED PATENT APPLICATION

This U.S. non-provisional patent application claims priority under 35 U.S.C. §119 of Korean Patent Application No. 10-2014-0029465 filed on Mar. 13, 2014 in the Korean Intellectual Property Office, the entire contents of which are hereby incorporated by reference.

BACKGROUND OF THE INVENTION

1. Field of the Invention

The present invention relates to an amplifier capable of controlling cut-off frequency in real time and an amplification method for controlling cut-off frequency in real time, and more particularly, to an amplifier capable of controlling cut-off frequency in real time and an amplification method for controlling cut-off frequency in real time 2. Description of the Related Art Characteristics of a loudspeaker are determined by its design. For instance, a woofer has a relatively large diameter suitable for reproducing an audio signal in a low frequency band while a tweeter has a relatively small diameter suitable for reproducing an audio signal in a high frequency band. The woofer has a large displacement when reproducing the audio signal in the low frequency band while the tweeter has a small displacement when reproducing the audio signal in the high frequency band. The displacement refers to a moving distance of a diaphragm or a cone of the loudspeaker. That is, the diaphragm or the cone swings back and forth by a long distance when the displacement is large, and the diaphragm or the cone swings back and forth by a short distance when the displacement is small.

In order to reproduce the audio signal without distortions, audio signal in an appropriate frequency band should be applied to the loudspeaker. For instance, the audio signal in the high frequency band should be applied to the tweeter in order to prevent distortions and damages. Thus, an audio playback device divides the audio signal according to the frequency band by proper filtering and applies the divided audio signal to corresponding loudspeakers.

Recently, the audio playback device is becoming smaller and thinner. Accordingly, the size and the thickness of a loudspeaker is also being reduced. For instance, latest digital televisions employ LCDs and digital audio amplifiers to drastically reduce the thickness thereof compared to conventional television. The size and the thickness of the loudspeakers in the digital televisions are also being reduced accordingly, resulting in loudspeakers having poor playback capability of audio signal in low frequency band.

Moreover, the enhancement in the playback capability of audio signal in low frequency band in a car stereo system is in trend. However, it is difficult to enhance the playback capability due to the structural characteristic of an automobile.

In order to solve above-described problems, equalizers are employed in the audio playback device capable of controlling a level of bass according to a user's input. However, a distortion or a rattling may occur when the user excessively enhances the bass.

SUMMARY OF THE INVENTION

To solve the problem described above, it is an object of the present invention to provide an amplifier and an amplification method wherein a cut-off frequency is dynamically adjusted in real time according to a low frequency level of an input audio signal to prevent a distortion of the audio signal.

According to one aspect of the present invention, there is provided an amplifier of a digital audio amplifier capable of driving a loudspeaker using an input digital audio signal, the amplifier comprising: a variable high-pass filter unit configured to filter the input digital audio signal according to a cut-off frequency $F_c$; a displacement detector configured to detect in real time a displacement of the loudspeaker from an output digital audio signal outputted from the variable high-pass filter unit; and a controller configured to control the cut-off frequency $F_c$ of the variable high-pass filter unit in real time according to the displacement detected by the displacement detector.

The amplifier in accordance with the present invention may further comprise: a first bypass path configured to bypass the input digital audio signal; and a first switch configured to select and output one of the input digital audio signal bypassed by the first bypass path and the output digital audio signal of the variable high-pass filter unit.

Preferably, the variable high-pass filter unit comprises a first variable high-pass filter and a second variable high-pass filter in cascade, and wherein the input digital audio signal is sequentially high-pass filtered by the first variable high-pass filter and the second variable high-pass filter.

Preferably, the variable high-pass filter unit further comprises: a second bypass path configured to bypass an output signal of the first variable high-pass filter; and a second switch configured to select and output one of the output signal of the first variable high-pass filter bypassed by the second bypass path and an output signal of the second variable high-pass filter.

Preferably, the variable high-pass filter comprises a first variable high-pass filter and a second variable high-pass filter in cascade.

Preferably, the displacement detector comprises a biquad filter.

Preferably, the controller is configured to control in real time the cut-off frequency $F_c$ of each of the first variable high-pass filter and the second variable high-pass filter according to the displacement detected in real time by the displacement detector.

Preferably, the controller is configured to increase the cut-off frequency $F_c$ when the displacement detected by the displacement detector is greater than a reference value and to decrease the cut-off frequency $F_c$ when the displacement detected by the displacement detector is smaller than the reference value.

According to another aspect of the present invention, there is provided an amplification method performed in a digital audio amplifier capable of driving a loudspeaker using an input digital audio signal, the method comprising: (a) high-pass filtering the input digital audio signal according to a cut-off frequency $F_c$; (b) detecting in real time a displacement of the loudspeaker from an output digital audio signal obtained by filtering the input digital audio signal in the step (a); and (c) controlling the cut-off frequency $F_c$ in real time according to the displacement detected in the step (b).

The amplification method in accordance with the present invention may further comprise: selecting and outputting one of the input digital audio signal and the output digital audio signal obtained by filtering the input digital audio signal in the step (a).

Preferably, the step (a) comprises: (a-1) high-pass filtering the input digital audio signal according to the cut-off frequency $F_c$ by passing the input digital audio signal through a first variable high-pass filter to generate an output signal; and (a-2) high-pass filtering the output signal generated in the step (a-1) according to the cut-off frequency $F_c$ by passing the output signal through a second variable high-pass filter to generate the output digital audio signal.

The amplification method in accordance with the present invention may further comprise selecting and outputting one of the output signal and the output digital audio signal obtained by filtering the output signal in the step (a-2).

Preferably, the step (a) comprises: (a-1) high-pass filtering the input digital audio signal according to the cut-off frequency $F_c$ by passing the input digital audio signal through a first variable high-pass filter to generate an output signal; and (a-2) high-pass filtering the output signal generated in the step (a-1) according to the cut-off frequency $F_c$ by passing the output signal through a second variable high-pass filter to generate the output digital audio signal.

Preferably, the step (c) comprises controlling the cut-off frequency $F_c$ in real time in the steps (a-1) and (a-2) according to the displacement detected in the step (b) in real time.

Preferably, the step (b) comprises detecting in real time the displacement of the loudspeaker by biquad-filtering the output digital audio signal obtained by filtering the input digital audio signal in the step (a).

Preferably, the step (c) comprises increasing the cut-off frequency $F_c$ when the displacement detected by the step (b) is greater than a reference value and decreasing the cut-off frequency $F_c$ when the displacement detected in the step (b) is smaller than the reference value.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 1 is a block diagram illustrating an amplifier in accordance with a first embodiment of the present invention.

FIG. 2 is a block diagram illustrating an amplifier in accordance with a second embodiment of the present invention.

DETAILED DESCRIPTION OF THE PREFERRED EMBODIMENTS

Figure 3:
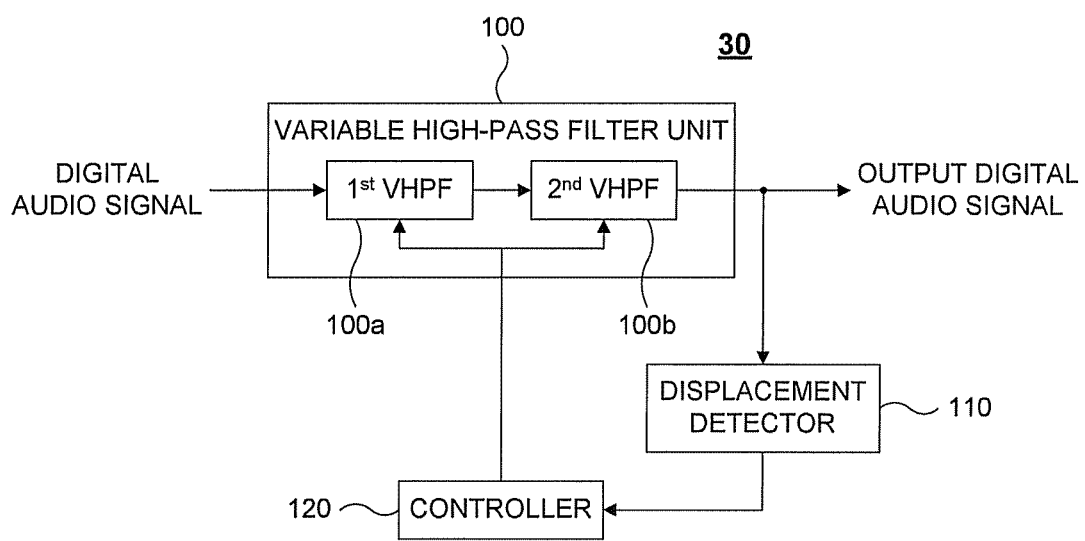
FIG. 3 is a block diagram illustrating an amplifier in accordance with a third embodiment of the present invention.

Hereinafter, a preferred embodiment of the present invention will be described in detail with reference to the accompanying drawings.

FIG. 1 is a block diagram illustrating an amplifier in accordance with a first embodiment of the present invention.

Referring to FIG. 1, the amplifier 10 in accordance with the first embodiment comprises a variable high-pass filter unit 100, a displacement detector 110 and a controller 120. The amplifier 10 of the present invention may be employed in a digital audio amplifier capable of driving a loudspeaker using an input digital audio signal.

The variable high-pass filter unit 100 filters the input digital audio signal according to a cut-off frequency $F_c$.

A transfer function H(z) of the variable high-pass filter unit 100 is exemplified in Equation 1 below.

$$H(z) = \frac{\left(\frac{1+\alpha}{2}\right) - \left(\frac{1+\alpha}{2}\right)z^{-1}}{1 - \alpha z^{-1}} \quad \text{[Equation 1]}$$

$\alpha$ is a coefficient determining the cut-off frequency $F_c$ of the variable high-pass filter unit 100, and the cut-off frequency $F_c$ can be adjusted by varying $\alpha$. For instance, the cut-off frequency $F_c$ decreases as $\alpha$ gets close to 1. The variable high-pass filter unit 100 passes the input digital audio signal having a frequency greater than the cut-off frequency $F_c$. For instance, when the cut-off frequency $F_c$ is in low frequency band, only a lower frequency portion of the input digital audio signal having a frequency higher than the cut-off frequency $F_c$ is passed through.

The displacement detector 110 detects in real time a displacement of the loudspeaker from an output digital audio signal outputted from the variable high-pass filter unit 100.

The displacement detector 110 may be implemented by a filter such as a digital biquad filter.

Since the displacement of a loudspeaker is a function of an amplitude and frequency of an audio signal applied thereto, the displacement of the loudspeaker can be calculated in real time by detecting the power or the spectrum of the output digital audio signal of the variable high-pass filter unit 100.

The controller 120 controls the cut-off frequency $F_c$ of the variable high-pass filter unit 100 in real time according to the displacement detected by the displacement detector 110.

The operation of the amplifier 10 in accordance with the present invention will be described in detail below.

The variable high-pass filter unit 100 receives the input digital audio signal and passes only the portion of the input digital audio signal in a frequency band higher than the cut-off frequency $F_c$. For instance, when the cut-off frequency $F_c$ is 30 Hz, only the portion of the input digital audio signal in a frequency band higher than 30 Hz is passed through.

The output digital audio signal outputted from the variable high-pass filter unit 100 is inputted to the displacement detector 110, and the displacement detector 110 detects the displacement of the loudspeaker from the output digital audio signal in real time. For instance, when the power (or energy) of the input digital audio signal in the frequency band higher than the cut-off frequency $F_c$ (i. e. The output digital audio signal) is large, the displacement of the loudspeaker is large when driven by the output digital audio signal, and when the power (or energy) of the input digital audio signal in the frequency band higher than the cut-off frequency $F_c$ is small, the displacement of the loudspeaker is small when driven by the output digital audio signal. Therefore, by calculating the power (or spectrum) of the output digital audio signal, the displacement of the loudspeaker can be detected in real time. Acoustically, since the displacement of the loudspeaker is a double integral of acoustic pressure, the displacement is inversely proportional to square of the frequency of a voltage signal inputted to the loudspeaker. Therefore, when the displacement detector 110 is implemented by a second order low-pass biquad filter having a gradient of 12 dB per octave, the simplest displacement detection is possible. However, more accurate the displacement can be obtained by more complicated algorithm.

The controller 120 increases or decreases the cut-off frequency $F_c$ of the variable high-pass filter unit 100 in real time according to the displacement detected by the displacement detector 110.

Figure 5:
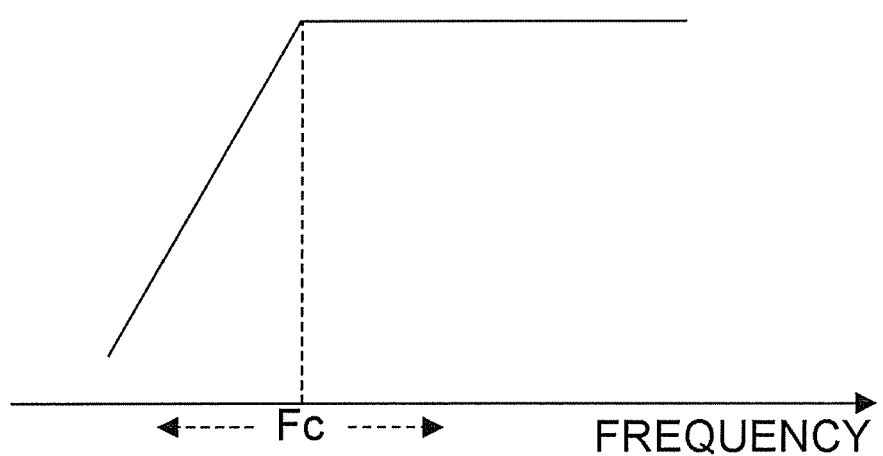
FIG. 5 is a graph illustrating a frequency response of a variable high-pass filter in accordance with the present invention.

Specifically, when the displacement detected by the displacement detector 110 exceeds the designed playback capability of the loudspeaker, the controller 120 increases the cut-off frequency $F_c$ of the variable high-pass filter unit 100 (see FIG. 5) to reduce the amount of bass in the digital audio signal applied to the loudspeaker. For instance, when the displacement is greater than a reference value with the cut-off frequency $F_c$ of the variable high-pass filter unit 100 set at 60 Hz, the controller 120 increases the cut-off frequency $F_c$ to 90 Hz such that the power of the portion of the digital audio signal in low frequency band applied to the loudspeaker decreases. Since the power of the portion of the digital audio signal in low frequency band applied to the loudspeaker decreases, the distortion of the audio signal or the damage to the loudspeaker can be prevented.

On the other hand, when the displacement detected by the displacement detector 110 is within the designed playback capability of the loudspeaker, the controller 120 decreases the cut-off frequency $F_c$ of the variable high-pass filter unit 100 (see FIG. 5) to increase the amount of bass in the digital audio signal applied to the loudspeaker. For instance, when the displacement is smaller than the reference value with the cut-off frequency $F_c$ of the variable high-pass filter unit 100 set at 60 Hz, the controller 120 decreases the cut-off frequency $F_c$ to 30 Hz such that the power of the portion of the digital audio signal in low frequency band applied to the loudspeaker increases. When the power of the portion of the digital audio signal in low frequency band applied to the loudspeaker is appropriately increased, the bass reproduced by the loudspeaker can be increased without the distortion of the audio signal and the damage to the loudspeaker.

FIG. 2 is a block diagram illustrating an amplifier in accordance with a second embodiment of the present invention.

Referring to FIG. 2, the amplifier 20 in accordance with the second embodiment comprises a variable high-pass filter unit 100, a displacement detector 110, a controller 120, a first bypass path 150 and a switch 130. The amplifier 20 of the present invention may be employed in a digital audio amplifier capable of driving a loudspeaker using an input digital audio signal.

The variable high-pass filter unit 100, the displacement detector 110 and the controller 120 shown in FIG. 2 are identical to those shown in FIG. 1. Therefore, detailed descriptions thereof are omitted.

The first bypass path 150 connects an input terminal of the variable high-pass filter unit 100 and the switch 130 to be able to bypasses the input digital audio signal.

The switch 130 selects and outputs one of the input digital audio signal bypassed by the first bypass path 150 and the output digital audio signal of the variable high-pass filter unit 100. For instance, when by pass is selected, the switch 130 connects to the input terminal of the variable high-pass filter unit 100 and outputs the input digital audio signal as the output digital audio signal. When by pass is not selected, the switch 130 connects to an output terminal of the variable high-pass filter unit 100 and outputs the output signal of the variable high-pass filter unit 100 as the output digital audio signal.

FIG. 3 is a block diagram illustrating an amplifier in accordance with a third embodiment of the present invention.

Referring to FIG. 3, the amplifier 30 in accordance with the third embodiment comprises a variable high-pass filter unit 100 including a first variable high-pass filter 100a and a second variable high-pass filter 100b, a displacement detector 110 and a controller 120. The amplifier 30 of the present invention may be employed in a digital audio amplifier capable of driving a loudspeaker using an input digital audio signal.

The displacement detector 110 shown in FIG. 3 is identical to one shown in FIG. 1. Therefore, detailed descriptions thereof are omitted.

The first variable high-pass filter 100a and the second variable high-pass filter 100b included in the variable high-pass filter unit 100 are connected in cascade (series) where an output terminal of the first variable high-pass filter 100a is connected to an input terminal of the second variable high-pass filter 100b. Therefore, the input digital audio signal is sequentially high-pass filtered by the first variable high-pass filter 100a and the second variable high-pass filter 100b. When the first variable high-pass filter 100a and the second variable high-pass filter 100b are used, a variable high-pass filter unit with a sharper curve compared to a variable high-pass filter unit including a single variable high-pass filter can be obtained. While FIG. 3 illustrates an example wherein the variable high-pass filter unit 100 including two the variable high-pass filters in cascade, the variable high-pass filter unit 100 may include three or more variable high-pass filters.

The controller 120 controls in real time each of the cut-off frequencies $F_c$ of the first variable high-pass filter 100a and the second variable high-pass filter 100b. That is, the controller 120 varies or adjusts the cut-off frequency $F_c$ of the first variable high-pass filter 100a and the cut-off frequency $F_c$ of the second variable high-pass filter 100b in real time according to the displacement detected by the displacement detector 110 in real time.

Figure 4:
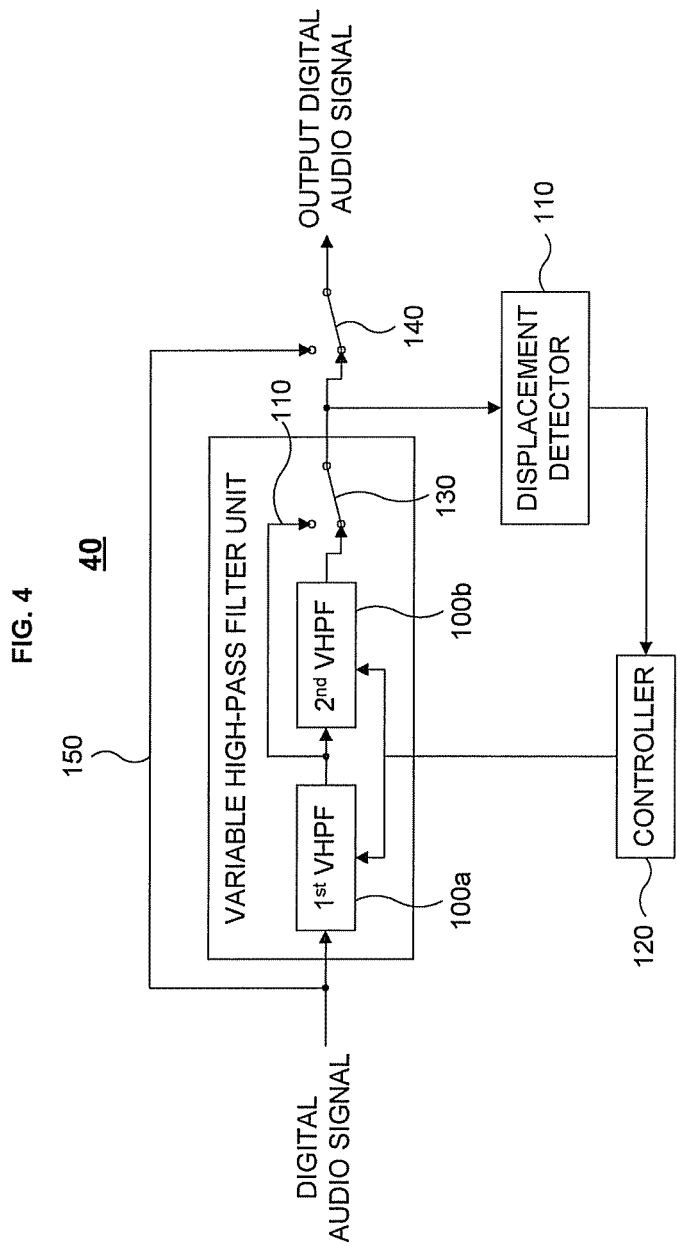
FIG. 4 is a block diagram illustrating an amplifier in accordance with a fourth embodiment of the present invention.

FIG. 4 is a block diagram illustrating an amplifier in accordance with a fourth embodiment of the present invention.

Referring to FIG. 4, the amplifier 40 in accordance with the fourth embodiment comprises a variable high-pass filter unit 100 including a first variable high-pass filter 100a and a second variable high-pass filter 100b, a displacement detector 110, a controller 120, a first switch 140 a second switch 130, a first bypass path 150 and a second bypass path 160. The amplifier 40 of the present invention may be employed in a digital audio amplifier capable of driving a loudspeaker using an input digital audio signal.

The variable high-pass filter unit 100 including the first variable high-pass filter 100a and the second variable high-pass filter 100b, the displacement detector 110 and the controller 120 shown in FIG. 4 are identical to those shown in FIG. 3. Therefore, detailed descriptions thereof are omitted.

The first bypass path 150 connects an input terminal of the variable high-pass filter unit 100 and the first switch 140 to be able to bypasses the input digital audio signal.

The first switch 140 selects and outputs one of the input digital audio signal bypassed by the first bypass path 150 and the output digital audio signal of the variable high-pass filter unit 100. For instance, when by pass is selected, the first switch 140 connects to the input terminal of the variable high-pass filter unit 100 and outputs the input digital audio signal as the output digital audio signal. When by pass is not selected, the first switch 140 connects to an output terminal of the variable high-pass filter unit 100 and outputs the output signal of the variable high-pass filter unit 100 as the output digital audio signal.

The second bypass path 160 connects an input terminal of the second variable high-pass filter 100b and the second switch 130 to be able to bypasses an output signal of the first variable high-pass filter 100a.

The second switch 130 selects and outputs one of the output signal bypassed by the first variable high-pass filter 100a and an output signal of the second variable high-pass filter 100b. For instance, when by pass is selected, the second switch 130 connects to the input terminal of the second variable high-pass filter 100b and outputs the output signal of the first variable high-pass filter 100a as the output digital audio signal. When by pass is not selected, the second switch 130 connects to an output terminal of the second variable high-pass filter 100b and outputs the output signal of the second variable high-pass filter 100b as the output digital audio signal.

While FIG. 4 illustrates the amplifier 40 including two variable high-pass filters, two bypass paths and two switches, one or three or more variable high-pass filters, bypass paths and switches can be employed.

Figure 6:
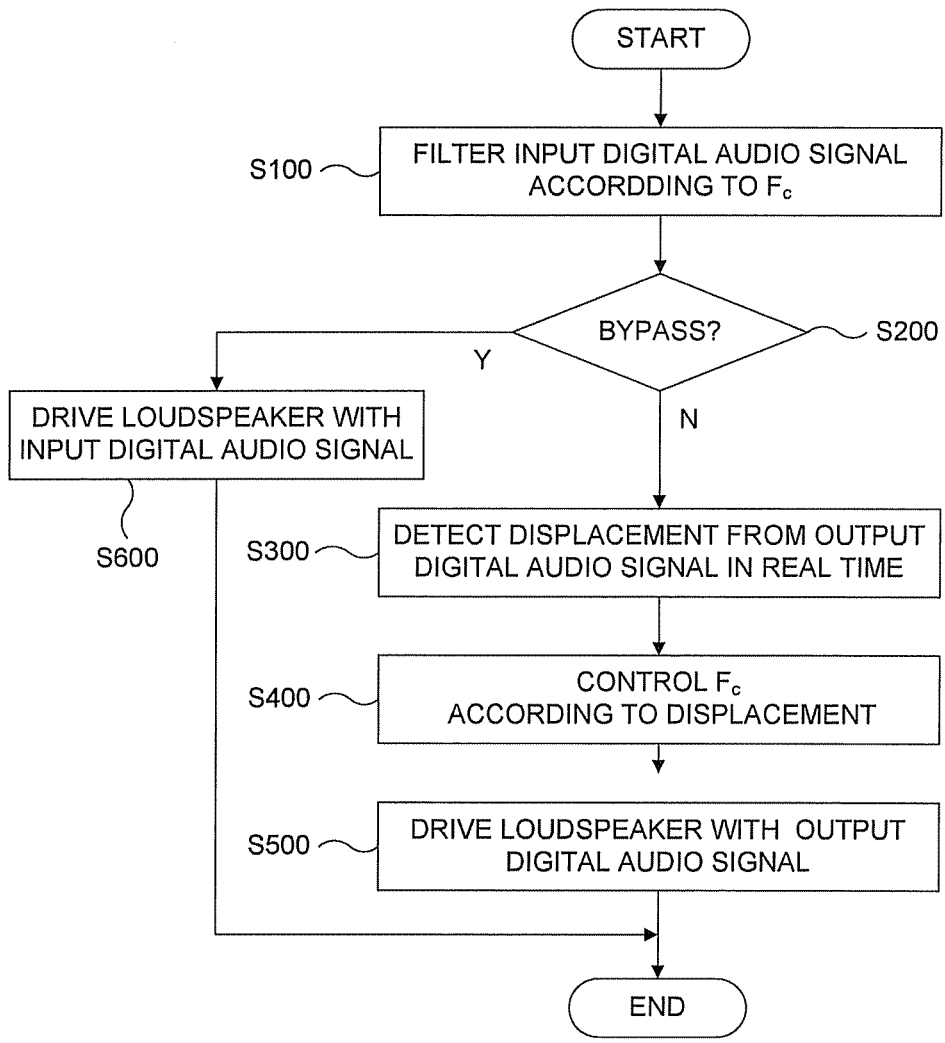
FIG. 6 is a flow diagram illustrating an amplification method in accordance with the present invention.

FIG. 6 is a flow diagram illustrating an amplification method in accordance with the present invention.

Referring to FIG. 6, the input digital audio signal is high-pass filtered according to a cut-off frequency $F_c$.

Thereafter, when bypass is selected (Y of S200), the input digital audio signal is outputted as the output digital audio signal (S600). Since the input digital audio signal is bypassed, the input digital audio signal drives the loudspeaker as the output digital audio signal.

When bypass is not selected (N of S200), a displacement of the loudspeaker is detected from the output digital audio signal obtained by the filtering in the step S100 (S300).

Thereafter, the cut-off frequency $F_c$ is controlled in real time according to the displacement detected in the step S300 (S400).

Thereafter, the loudspeaker is driven with the output digital audio signal obtained by the filtering in the step S100.

Figure 7:
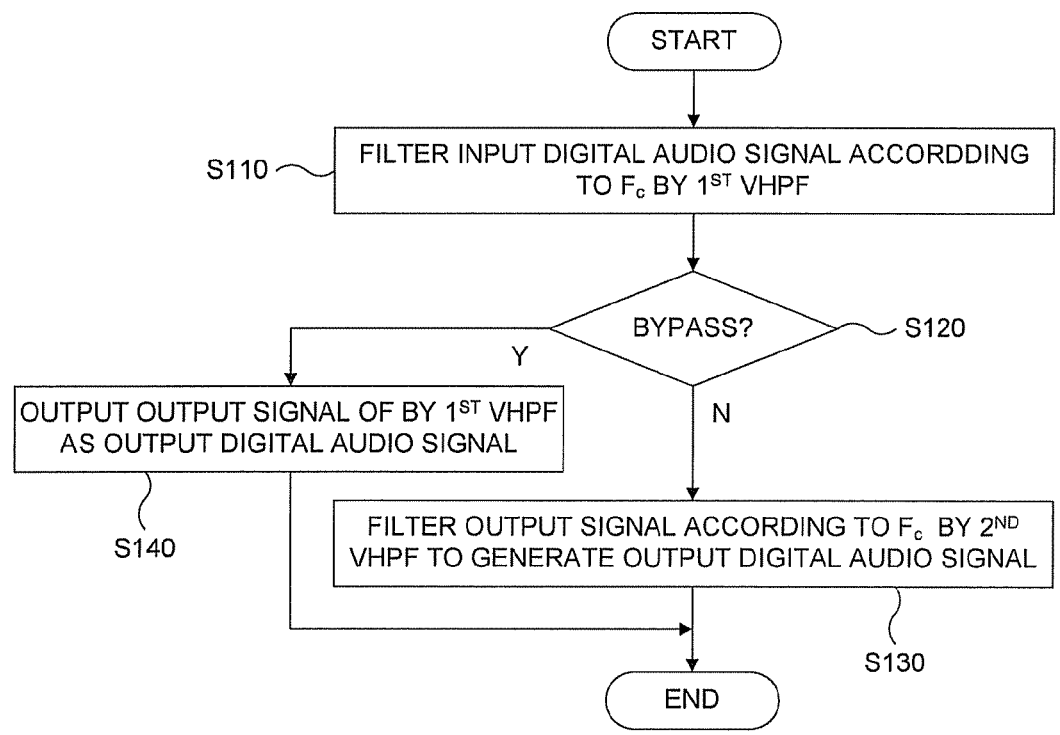
FIG. 7 is a flow diagram illustrating step S100 of the amplification method performed in the amplifier shown in FIG. 4 in accordance with the present invention.

FIG. 7 is a flow diagram illustrating step S100 of the amplification method performed in the amplifier shown in FIG. 4 including the first variable high-pass filter 100a, the second variable high-pass filter 100b, the first switch 140, the second switch 130, the first bypass path 150 and the second bypass path 160 in accordance with the present invention. Although the amplification method shown in FIG. 7 also includes the steps S200 through S600 shown in FIG. 6, detailed descriptions of the steps S200 through S600 are omitted because the steps S200 through S600 of the amplification method shown in FIG. 7 are identical to those shown in FIG. 6.

Referring to FIG. 7, an output signal is generated by filtering the input digital audio signal according to the cut-off frequency $F_c$ (S110). The step S110 is performed by the first variable high-pass filter 100a of the two cascaded variable high-pass filters shown in FIG. 4.

Thereafter, when bypass is selected (Y of S120), the output signal is outputted as the output digital audio signal (S140). Since the output signal is bypassed, the output signal drives the loudspeaker as the output digital audio signal.

When bypass is not selected (N of S120), the output digital audio signal is generated by high-pass filtering according to the cut-off frequency $F_c$ the output signal obtained by the filtering in the step S110 (S130).

Thereafter, the steps S200 through S600 shown in FIG. 6 are performed.

The present invention provides the following advantages:
(i) since the cut-off frequency of the variable high-pass filter is controlled in real time according to a bass level of the input audio signal, the range of low frequency audio signal inputted to the loudspeaker may be controlled in real time;
(ii) since the cut-off frequency of the variable high-pass filter is controlled in real time according to a bass level of the input audio signal, the input audio signal may be appropriately reproduced by reflecting the characteristic and capability of the loudspeaker; and
(iii) since the cut-off frequency of the variable high-pass filter is controlled in real time in a manner that the low frequency audio signal is not excessively inputted to the loudspeaker, the damage and the rattling of the loudspeaker and the distortion of the audio signal are prevented.

What is claimed is:

1. An amplifier of a digital audio amplifier capable of driving a loudspeaker using an input digital audio signal, the amplifier comprising:
   a variable high-pass filter unit configured to filter the input digital audio signal according to a cut-off frequency Fc;
   a displacement detector configured to detect in real time a displacement of the loudspeaker from an output digital audio signal outputted from the variable high-pass filter unit;
   a controller configured to control the cut-off frequency Fc of the variable high-pass filter unit in real time according to the displacement detected by the displacement detector,
   a first bypass path configured to bypass the input digital audio signal; and
   a first switch configured to select and output one of the input digital audio signal bypassed by the first bypass path and the output digital audio signal of the variable high-pass filter unit.

2. The amplifier in accordance with claim 1, wherein the variable high-pass filter unit comprises a first variable high-pass filter and a second variable high-pass filter in cascade, and wherein the input digital audio signal is sequentially high-pass filtered by the first variable high-pass filter and the second variable high-pass filter.

3. The amplifier in accordance with claim 2, wherein the variable high-pass filter unit further comprises: a second bypass path configured to bypass an output signal of the first variable high-pass filter; and a second switch configured to select and output one of the output signal of the first variable high-pass filter bypassed by the second bypass path and an output signal of the second variable high-pass filter.

4. The amplifier in accordance with claim 1, wherein the variable high-pass filter comprises a first variable high-pass filter and a second variable high-pass filter in cascade.

5. The amplifier in accordance with claim 4, wherein the controller is configured to control in real time the cut-off frequency Fc of each of the first variable high-pass filter and the second variable high-pass filter according to the displacement detected in real time by the displacement detector.

6. The amplifier in accordance with claim 1, wherein the displacement detector comprises a biquad filter.

7. The amplifier in accordance with claim 1, wherein the controller is configured to increase the cut-off frequency Fc when the displacement detected by the displacement detector is greater than a reference value and to decrease the cut-off frequency Fc when the displacement detected by the displacement detector is smaller than the reference value.

8. An amplification method performed in a digital audio amplifier capable of driving a loudspeaker using an input digital audio signal, the method comprising:
   (a) high-pass filtering the input digital audio signal according to a cut-off frequency Fc;
   (b) detecting in real time a displacement of the loudspeaker from an output digital audio signal obtained by filtering the input digital audio signal in the step (a); and
   (c) controlling the cut-off frequency Fc in real time according to the displacement detected in the step (b); and (d) selecting and outputting one of the input digital audio signal and the output digital audio signal obtained by filtering the input digital audio signal in the step (a).

9. The amplification method in accordance with claim 8, wherein the step (a) comprises:
   (a-1) high-pass filtering the input digital audio signal according to the cut-off frequency Fc by passing the input digital audio signal through a first variable high-pass filter to generate an output signal; and
   (a-2) high-pass filtering the output signal generated in the step (a-1) according to the cut-off frequency Fc by passing the output signal through a second variable high-pass filter to generate the output digital audio signal.

10. The amplification method in accordance with claim 9, further comprising selecting and outputting one of the output signal and the output digital audio signal obtained by filtering the output signal in the step (a-2).

11. The amplification method in accordance with claim 9, wherein the step (c) comprises controlling the cut-off frequency Fc in real time in the steps (a-1) and (a-2) according to the displacement detected in the step (b) in real time.

12. The amplification method in accordance with claim 8, wherein the step (b) comprises detecting in real time the displacement of the loudspeaker by biquad-filtering the output digital audio signal obtained by filtering the input digital audio signal in the step (a).

13. The amplification method in accordance with claim 8, wherein the step (c) comprises increasing the cut-off frequency Fc when the displacement detected by the step (b) is greater than a reference value and decreasing the cut-off frequency Fc when the displacement detected in the step (b) is smaller than the reference value.

\* \* \* \* \*